(12) United States Patent
Hou

(10) Patent No.: US 11,706,935 B2
(45) Date of Patent: Jul. 18, 2023

(54) ELECTROLUMINESCENT DEVICE COMPRISING A TARGET FILM COMPRISING A SMALL MOLECULAR LAYER AND A LARGE MOLECULAR LAYER AND METHOD FOR FABRICATING THE SAME, DISPLAY PANEL AND DISPLAY DEVICE

(71) Applicant: BOE TECHNOLOGY GROUP CO., LTD., Beijing (CN)

(72) Inventor: Wenjun Hou, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 119 days.

(21) Appl. No.: 16/620,849

(22) PCT Filed: Mar. 8, 2019

(86) PCT No.: PCT/CN2019/077472
§ 371 (c)(1),
(2) Date: Dec. 9, 2019

(87) PCT Pub. No.: WO2019/214335
PCT Pub. Date: Nov. 14, 2019

(65) Prior Publication Data
US 2020/0119300 A1    Apr. 16, 2020

(30) Foreign Application Priority Data
May 11, 2018 (CN) .......................... 201810448037.9

(51) Int. Cl.
*H01L 51/50* (2006.01)
*H10K 50/15* (2023.01)
(Continued)

(52) U.S. Cl.
CPC ............. *H10K 50/11* (2023.02); *H10K 50/15* (2023.02); *H10K 50/156* (2023.02); *H10K 50/16* (2023.02);
(Continued)

(58) Field of Classification Search
CPC ............. H01L 51/5004; H01L 51/5056; H01L 51/5072; H01L 51/5092; H10K 50/156
See application file for complete search history.

(56) References Cited

U.S. PATENT DOCUMENTS

2005/0212003 A1* 9/2005 Murakami .......... H01L 51/5092
257/98
2007/0075627 A1* 4/2007 Kimura ............... H01L 27/3216
313/503
(Continued)

FOREIGN PATENT DOCUMENTS

CN    105870154 A  *  8/2016  ............. H01L 51/52
CN    106433615 A     2/2017
(Continued)

OTHER PUBLICATIONS

Office Action received for Chinese Patent Application No. 201810448037.9, dated Jul. 3, 2020, 18 pages (10 pages of English Translation and 8 pages of Office Action).
(Continued)

*Primary Examiner* — Anh D Mai
(74) *Attorney, Agent, or Firm* — Womble Bond Dickinson (US) LLP

(57) ABSTRACT

An electroluminescent device, a method for fabricating the same, a display panel, and a display device are disclosed. The electroluminescent device includes a hole inject layer, a hole transport layer, an electron transport layer, and an electron inject layer. At least one of the hole inject layer, the hole transport layer, the electron transport layer, and electron
(Continued)

inject layer is a target film including a small molecular layer and a large molecular layer which are arranged in a stacked manner.

11 Claims, 7 Drawing Sheets

(51) Int. Cl.
　　　H10K 50/11　　　(2023.01)
　　　H10K 50/16　　　(2023.01)
　　　H10K 50/17　　　(2023.01)
　　　H10K 101/40　　(2023.01)
　　　H10K 101/30　　(2023.01)
(52) U.S. Cl.
　　　CPC ....... *H10K 50/171* (2023.02); *H10K 2101/30* (2023.02); *H10K 2101/40* (2023.02)

(56) References Cited

U.S. PATENT DOCUMENTS

| | | | |
|---|---|---|---|
| 2013/0187138 A1 | 7/2013 | Matsumoto et al. | |
| 2017/0062734 A1 | 3/2017 | Suzuki et al. | |
| 2017/0207407 A1 | 7/2017 | Liao | |
| 2018/0062030 A1* | 3/2018 | Chung | H01L 51/5275 |
| 2019/0067617 A1 | 2/2019 | Tanaka | |
| 2019/0229298 A1 | 7/2019 | Shi | |
| 2020/0119300 A1 | 4/2020 | Hou | |

FOREIGN PATENT DOCUMENTS

| | | |
|---|---|---|
| CN | 106981579 A | 7/2017 |
| CN | 105070845 B | 12/2017 |
| CN | 107623076 A | 1/2018 |
| CN | 107925009 A | 4/2018 |
| CN | 108649131 A | 10/2018 |
| WO | 2017/149636 A1 | 9/2017 |

OTHER PUBLICATIONS

International Search Report received for PCT Patent Application No. PCT/CN2019/077472, dated Jun. 12, 2019, 8 pages (3 pages of English Translation and 5 pages of Original Document).

Office Action received for Chinese Patent Application No. 201810448037.9, dated Jun. 13, 2019, 21 pages (12 pages of English Translation and 9 pages of Office Action).

Office Action received for Chinese Patent Application No. 201810448037.9, dated Nov. 25, 2019, 8 pages (5 pages of English Translation and 3 pages of Office Action).

Sayin et al., "Synthesis of isoniazid substituted pyrene (PINHy), and investigation of its optical and electrochemical features as tunable/flexible OLEDs", Journal of Materials Science: Materials in Electronics, vol. 28, May 18, 2017, 7 pages.

* cited by examiner

ELECTROLUMINESCENT DEVICE COMPRISING A TARGET FILM COMPRISING A SMALL MOLECULAR LAYER AND A LARGE MOLECULAR LAYER AND METHOD FOR FABRICATING THE SAME, DISPLAY PANEL AND DISPLAY DEVICE

RELATED APPLICATIONS

The present application is the U.S. national phase entry of PCT/CN2019/077472, with an international filing date of Mar. 8, 2019, which claims the benefit of Chinese Patent Application No. 201810448037.9, filed May 11, 2018, the entire disclosures of which are incorporated herein by reference.

TECHNICAL FIELD

The present application relates to the field of display technologies, and particularly to an electroluminescent device, a method for fabricating the same, a display panel, and a display device.

BACKGROUND

With the development of technologies, a display panel is being widely applied in the daily life due to its excellent display effect.

The display panel usually comprises a substrate and a plurality of pixels on the substrate, and each pixel comprises an electroluminescent device for emitting light. The electroluminescent device is usually formed by a stack of a plurality of films, and the plurality of films are usually formed by a solution process.

SUMMARY

In an aspect, it is provided an electroluminescent device, comprising a hole inject layer, a hole transport layer, an electron transport layer, and an electron inject layer, wherein at least one of the hole inject layer, the hole transport layer, the electron transport layer, and the electron inject layer is a target film comprising a small molecular layer and a large molecular layer which are arranged in a stacked manner.

In one or more embodiments, the small molecular layer has a thickness larger than that of the large molecular layer.

In one or more embodiments, the electroluminescent device comprises a first electrode, the hole inject layer, the hole transport layer, an electroluminescent layer, the electron transport layer, the electron inject layer, and a second electrode which are arranged in a stacked manner.

In one or more embodiments, the hole transport layer is the target film.

In one or more embodiments, an HOMO energy level of the small molecular layer and an HOMO energy level of the large molecular layer increase in a hole transport direction of the electroluminescent device.

In one or more embodiments, a molecular layer of the hole transport layer close to the electroluminescent layer has an HOMO energy level of 4.6 eV, and a molecular layer away from the electroluminescent layer has an HOMO energy level of 4.76 eV.

In one or more embodiments, a molecular layer of the hole transport layer close to the electroluminescent layer has an HOMO energy level of 5.1 eV, and a molecular layer away from the electroluminescent layer has an HOMO energy level of 5.7 eV.

In one or more embodiments, a molecular layer of the hole transport layer close to the electroluminescent layer has a cross-linked network structure.

In one or more embodiments, the electron transport layer is the target film.

In one or more embodiments, an LUMO energy level of the small molecular layer and an LUMO energy level of the large molecular layer increase in an electron transport direction in the electroluminescent device.

In one or more embodiments, a molecular layer of the electron transport layer close to the electroluminescent layer has an LUMO energy level of 2.6 eV, and a molecular layer away from the electroluminescent layer has an HOMO energy level of 2.8 eV.

In one or more embodiments, a molecular layer of the electron transport layer close to the electroluminescent layer has an LUMO energy level of 2.5 eV, and a molecular layer away from the electroluminescent layer has an HOMO energy level of 2.7 eV.

In one or more embodiments, a molecular layer of the electron transport layer close to the electroluminescent layer has a cross-linked network structure.

In one or more embodiments, the target film comprises at least one small molecular layer and at least one large molecular layer, and the small molecular layer and the large molecular layer are arranged alternately.

In one or more embodiments, a material for the large molecular layer is polythiophene or polyaniline, and a material for the small molecular layer is ethylenedioxythiophene or triphenylamine.

In one or more embodiments, both a material for the first electrode and a material for the second electrode are tin indium oxide, a material for the electron transport layer is tungsten oxide, a material for the electron inject layer is molybdenum oxide, and a material for the hole inject layer is vanadium oxide.

In another aspect, it is provided a method for fabricating an electroluminescent device, comprising: forming an electroluminescent device on a substrate, wherein the electroluminescent device comprises a hole inject layer, a hole transport layer, an electron transport layer, and an electron inject layer, wherein at least one of the hole inject layer, the hole transport layer, the electron transport layer, and the electron inject layer is a target film comprising a small molecular layer and a large molecular layer which are arranged in a stacked manner.

In one or more embodiments, the small molecular layer has a thickness larger than that of the large molecular layer.

In one or more embodiments, forming the electroluminescent device on the substrate comprises:

forming a first electrode, the hole inject layer, the hole transport layer, an electroluminescent layer, the electron transport layer, the electron inject layer, and a second electrode which are arranged in a stacked manner, on the substrate, wherein the hole transport layer is the target film, an HOMO energy level of the small molecular layer and an HOMO energy level of the large molecular layer increase in a hole transport direction of the electroluminescent device.

In one or more embodiments, the hole transport layer is the target film, and forming the electroluminescent device on the substrate comprises:

forming a first electrode and the hole inject layer which are arranged in a stacked manner;

forming a first molecular layer in the hole transport layer, on the hole inject layer;

forming a preset solution on the first molecular layer, wherein the solute of the preset solution comprises cross-linking groups, and molecules in the second molecular layer in the hole transport layer;

drying the preset solution for forming a film, so that the solvent in the preset solution evaporates to form the second molecular layer in the hole transport layer, wherein the second molecular layer comprises a cross-linked network structure formed by the cross-linking groups; and forming an electroluminescent layer, the electron transport layer, the electron inject layer, and a second electrode which are arranged in a stacked manner, on the second molecular layer.

In yet another aspect, it is provided a display panel, comprising a substrate, and a plurality of electroluminescent devices of claim 1 on the substrate.

In still another aspect, it is provided a display device comprising the above display panel.

It is understood that the above general description and the following detailed description are exemplary in nature, and does not limit the present application in any manner.

BRIEF DESCRIPTION OF THE DRAWINGS

In order to explain the technical solutions in the embodiments of the present application more clearly, the drawings to be used in the description of the embodiments will be introduced briefly in the following. Apparently, the drawings described below are only some embodiments of the present application, a person with ordinary skill in the art, on the premise of not paying any creative work, can also obtain other drawings from these drawings.

The drawings are incorporated into the specification and act as a part of the specification. The drawings illustrate embodiments of the present application. The drawings in combination with the specification are used to explain the principle of the present application.

DETAILED DESCRIPTION OF EMBODIMENTS

To make the objects, the technical solutions and the advantages of embodiments of the present application more apparent, the technical solutions of the embodiments of the present application will be described in detail hereinafter in conjunction with the drawings of the embodiments of the present application.

The display panel has been widely applied. The display panel usually comprises a substrate and a plurality of pixels on the substrate. Each pixel comprises an electroluminescent device for emitting light, and the electroluminescent device is usually formed by a plurality of films which are stacked. In case a target film of the plurality of films is formed by a solution process, and the target film comprises large molecules, a layer of a solution comprising large molecules is usually formed by inkjet printing, the solution comprising large molecules is then dried for forming a film, so as to form the target film. When the solution comprising large molecules is being dried for forming a film, viscosity of the solution increases, and a volatilization rate of the solution is decreased. As a result, the target film is difficult to form, and accordingly the display panel is difficult to form.

Figure 1:
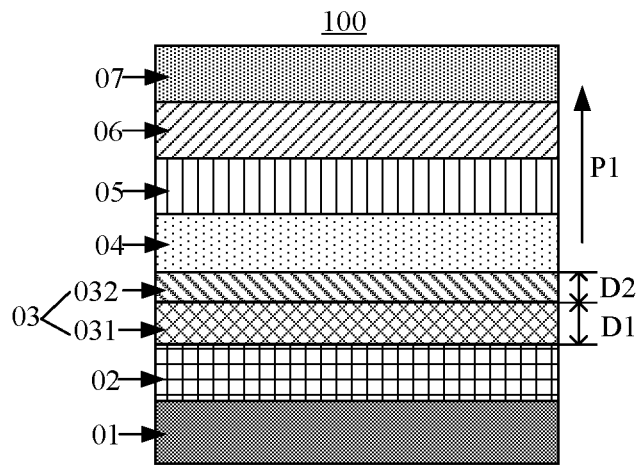
FIG. 1 is a structural view for illustrating an electroluminescent device in an embodiment of the present application.

FIG. 1 is a structural view for an electroluminescent device in an embodiment of the present application. As shown in FIG. 1, an electroluminescent device 100 for example comprises: a hole inject layer 02, a hole transport layer 03, an electron transport layer 05, and an electron inject layer 06. At least one of the hole inject layer 02, the hole transport layer 03, the electron transport layer 05, and the electron inject layer 06 is a target film. In embodiments of the present application, the hole transport layer is taken as an example of the target film. The target film comprises a small molecular layer 031 and a large molecular layer 032 which are arranged in a stacked manner.

It is noted that, the small molecule is a molecule with a relative molecular mass smaller than 500, and the large molecule is a molecule with a relative molecular mass of several thousands to several millions. The small molecular layer 031 comprises the small molecule, and the large molecular layer 032 comprises the large molecule.

To sum up, in the electroluminescent device according to embodiments of the present application, the target film comprises the large molecular layer and the small molecular layer which are arranged in a stacked manner, so that the thickness of the large molecular layer in the target film is reduced. In addition, the smaller the thickness of the large molecular layer is, the more easily the large molecular layer can be formed by the solution process. As a result, the large molecular layer in the present application can be formed easily. During forming the small molecular layer by the solution process, the viscosity of the solution for forming the small molecular layer does not increase, so that the small molecular layer can be formed at reduced difficulty. Thus, the entire target film can be formed easily, and the display panel can be fabricated at reduced difficulty.

Referring to FIG. 1, the electroluminescent device 100 for example comprises a first electrode 01, the hole inject layer 02, the hole transport layer 03, an electroluminescent layer 04, the electron transport layer 05, the electron inject layer 06, and a second electrode 07, which are arranged in a stacked manner. For example, the hole transport layer 03 is the target film, and the molecular layer of the hole transport layer 03 close to the electroluminescent layer 04 has a cross-linked network structure.

It is noted that, in case a film in the electroluminescent device is formed by the solution process, the solution for forming the film comprises a solvent, and the solvent can be a polar solvent or a non-polar solvent. As an example, a first film and a second film are any two neighboring films in the electroluminescent device, and the first film and the second film are formed in this order. In case the solvent in the solution for forming the first film and the solvent in the solution for forming the second film are of a same type (e.g., both are polar solvents or both are non-polar solvents), the first film can be dissolved by the solvent in the solution for forming the second film. As an example, both the electroluminescent layer 04 and the hole transport layer 03 are formed by the solution process, and the hole transport layer 03 and the electroluminescent layer 04 are formed in this order. Both the solvent in the solution for forming the electroluminescent layer 04 and the solvent in the solution for forming the hole transport layer 03 are a polar solvent. During the solution for forming the electroluminescent layer 04 is formed on the hole transport layer 03, the molecular layer of the hole transport layer 03 close to the electroluminescent layer 04 has a cross-linked network structure, and the cross-linked network structure can prevent the hole transport layer 03 from being dissolved by the solvent in the solution for forming the electroluminescent layer 04.

The cross-linked network structure in the target film for example is formed by cross-linking groups. Optionally, the molecular layer of the hole transport layer 03 close to the electroluminescent layer 04 is the large molecular layer 032. When the large molecular layer 032 is formed by the solution process, a solute in the solution for forming the large molecular layer 032 comprises the large molecule and the cross-linking groups. The cross-linking groups are attached to the large molecule with a relatively long molecular chain, and the cross-linked network structure which is formed in the subsequent drying for forming a film has good continuity. Thus, this can further prevent the hole transport layer 03 from being dissolved by the solvent in the solution for forming the electroluminescent layer 04. In addition, it is noted that, in the example of FIG. 1, the molecular layer close to the electroluminescent layer 04 is the large molecular layer 032. For example, in practice, the molecular layer close to the electroluminescent layer 04 is the small molecular layer 031, and embodiments of the present application are not limited in this regard.

Optionally, a thickness D1 of the small molecular layer 031 is larger than a thickness D2 of the large molecular layer 032. In this case, the thickness D2 of the large molecular layer 032 in the target film is further reduced. Thus, the difficulty for forming the large molecular layer 032 is further reduced, and the difficulty for forming the display panel is further reduced.

Optionally, in case the hole transport layer 03 is the target film, an HOMO (highest occupied molecular orbital) energy level of the small molecular layer 031 and an HOMO energy level of the large molecular layer 032 in the hole transport layer 03 increase in a hole transport direction of the electroluminescent device 100. The hole is transported quickly from the molecular layer with a low HOMO energy level to the molecular layer with a high HOMO energy level. Thus, in case the hole transport layer is the target film, the hole is transported in the electroluminescent device 100 quickly.

As an example, the molecular layer of the hole transport layer 03 close to the electroluminescent layer 04 has an HOMO energy level of 4.6 eV, and the molecular layer of the hole transport layer 03 away from electroluminescent layer has an HOMO energy level of 4.76 eV. In practice, the molecular layer close to the electroluminescent layer 04 can further have another HOMO energy level (e.g., 5.1 eV), and the molecular layer away from electroluminescent layer can further have another HOMO energy level (e.g., 5.7 eV). Embodiments of the present application are not limited in this regard.

Figure 2:
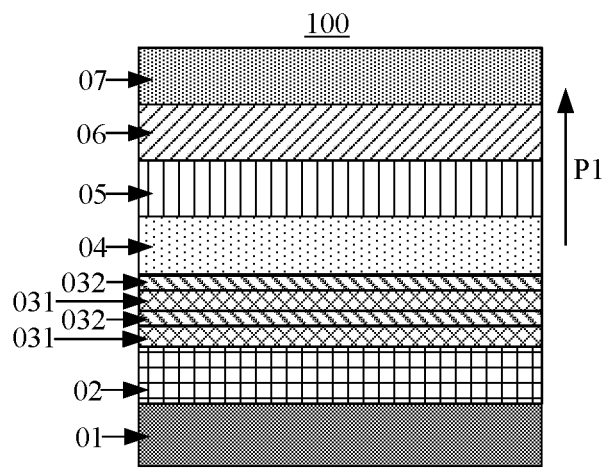
FIG. 2 is a structural view for illustrating an electroluminescent device in another embodiment of the present application.

Optionally, the target film comprises at least one small molecular layer 031 and at least one large molecular layer 032, and the small molecular layers and the large molecular layers are arranged alternately. It is noted that, FIG. 1 shows an example in which the target film comprises one small molecular layer 031 and one large molecular layer 032. In practice, as shown in FIG. 2, the target film can further comprise a plurality of (e.g. two) small molecular layers 031 and a plurality of (e.g. two) large molecular layer 032. Embodiments of the present application are not limited in this regard.

Optionally, a material for the large molecular layer is polythiophene, and a material for small molecular layer is ethylenedioxythiophene. In practice, the material for large molecular layer can further be another material (e.g., polyaniline), and the material for the small molecular layer can further be another material (e.g., triphenylamine). Embodiments of the present application are not limited in this regard.

Optionally, both a material for the first electrode and a material for the second electrode are tin indium oxide, a material for the electron transport layer is tungsten oxide, a material for the electron inject layer is molybdenum oxide, and a material for the hole inject layer is vanadium oxide. In practice, both the material for the first electrode and the material for the second electrode can further be another material (e.g., indium oxide), the material for the electron transport layer can further be another material (e.g., fullerene), the material for the electron inject layer can further be another material (e.g., naphthalene porphyrins), and the material for the hole inject layer can further be another material (e.g., polypropylene). Embodiments of the present application are not limited in this regard.

It is noted that, FIG. 1 and FIG. 2 only show an example in which a direction P1 for forming films in the electroluminescent device 100 is a direction from the first electrode 01 to the second electrode 07, and the hole transport layer 03 is the target film.

In practice, the direction for forming films in the electroluminescent device 100 can also be a direction from the second electrode 07 to the first electrode 01, and the electron transport layer 05 can also be the target film. Namely, the target film in the electroluminescent device 100 can be arranged in several possible implementations. The possible implementations other than the implementations in FIG. 1 will be described hereinafter.

Figure 3:
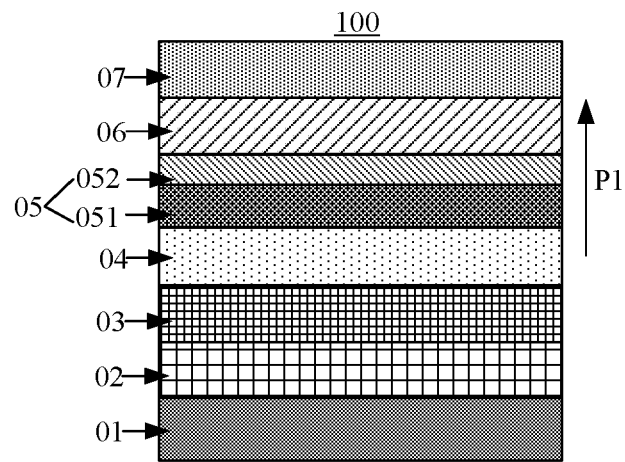
FIG. 3 is a structural view for illustrating an electroluminescent device in yet another embodiment of the present application.

In a first possible implementation, as shown in FIG. 3, the direction P1 for forming films in the electroluminescent device 100 is a direction from the first electrode 01 to the second electrode 07, and the electron transport layer 05 is the target film, the electron transport layer 05 comprise a small molecular layer 051 and a large molecular layer 052.

Figure 4:
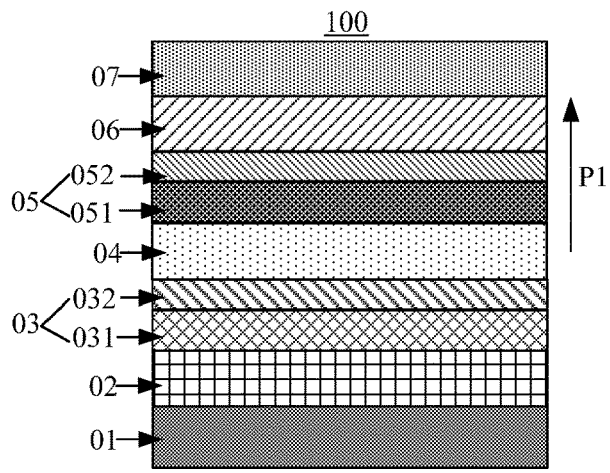
FIG. 4 is a structural view for illustrating an electroluminescent device in still another embodiment of the present application.

In a second possible implementation, as shown in FIG. 4, the direction P1 for forming films in the electroluminescent device 100 is a direction from the first electrode 01 to the second electrode 07, and both the electron transport layer 05 and the hole transport layer 03 can be the target film. It is noted that, FIG. 3 and FIG. 4 only show an example in which the large molecular layer 052 in the electron transport layer 05 is arranged close to the electron inject layer 06. In practice, the small molecular layer 051 in the electron transport layer 05 can also be arranged close to the electron inject layer 06. Embodiments of the present application are not limited in this regard.

Figure 5:
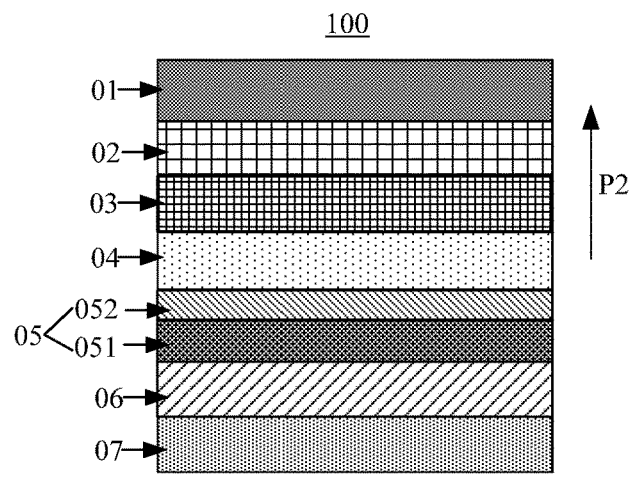
FIG. 5 is a structural view for illustrating an electroluminescent device in still another embodiment of the present application.

In a third possible implementation, as shown in FIG. 5, the direction P2 for forming films in the electroluminescent device 100 is a direction from the second electrode 07 to the first electrode 01, and the electron transport layer 05 is the target film.

Figure 6:
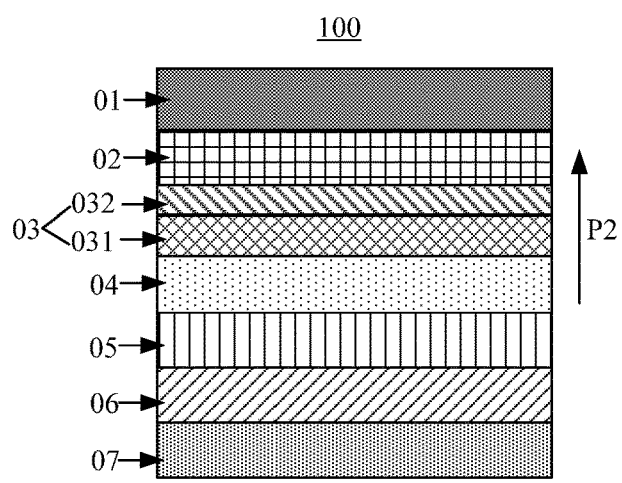
FIG. 6 is a structural view for illustrating an electroluminescent device in still another embodiment of the present application.

In a fourth possible implementation, as shown in FIG. 6, the direction P2 for forming films in the electroluminescent device 100 is a direction from the second electrode 07 to the first electrode 01, and the hole transport layer 03 is the target film.

Figure 7:
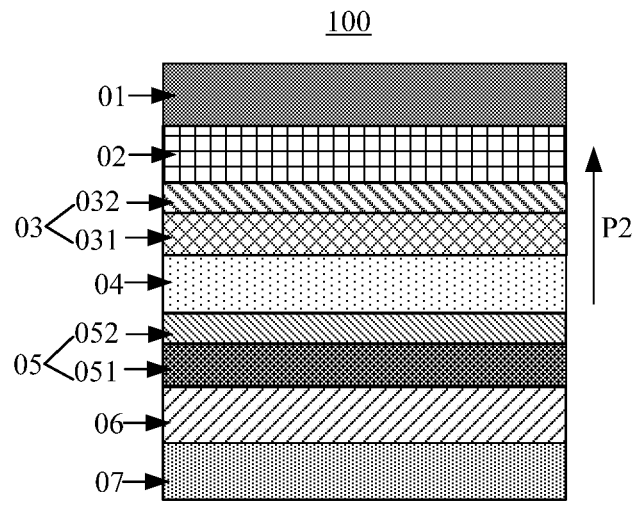
FIG. 7 is a structural view for illustrating an electroluminescent device in still another embodiment of the present application.

In a fifth possible implementation, as shown in FIG. 7, the direction P2 for forming films in the electroluminescent device 100 is a direction from the second electrode 07 to the first electrode 01, and both the electron transport layer 05 and the hole transport layer 03 are the target film. It is noted that, FIGS. 5-7 only show an example in which the large molecular layer 052 in the electron transport layer 05 is arranged close to the electroluminescent layer 04, and the large molecular layer 032 in the hole transport layer 03 is arranged close to the hole inject layer 02. In practice, the small molecular layer 051 in the electron transport layer 05 can also be arranged close to the electroluminescent layer 04, the small molecular layer 031 in the hole transport layer 03 can also be arranged close to the hole inject layer. Embodiments of the present application are not limited in this regard.

It is noted that, in case the electron transport layer 05 is the target film, an LUMO (lowest unoccupied molecular orbital) energy level of the small molecular layer 051 and an LUMO energy level of the large molecular layer 052 in the electron transport layer 05 increase in an electron transport direction in the electroluminescent device 100. Electrons are transported quickly from a molecular layer with a low LUMO energy level to a molecular layer with a high LUMO energy level. Thus, in case the electron transport layer is the target film, electrons are transported quickly in the electroluminescent device 100.

As an example, the molecular layer of the electron transport layer 05 close to the electroluminescent layer 04 has an LUMO energy level of 2.6 eV, and the molecular layer away from electroluminescent layer has an LUMO energy level of 2.8 eV. In practice, the molecular layer close to the electroluminescent layer 04 can further have another LUMO energy level (e.g., 2.5 eV), and the molecular layer away from the electroluminescent layer 04 can further have another LUMO energy level (e.g., 2.7 eV). Embodiments of the present application are not limited in this regard.

In addition, embodiments of the present application only show an example in which the hole transport layer and/or the electron transport layer comprises a small molecular layer and a large molecular layer which are arranged in a stacked manner. In practice, the hole inject layer and/or the electron inject layer can also comprise a small molecular layer and a large molecular layer which are arranged in a stacked manner. Embodiments of the present application are not limited in this regard.

Optionally, the electroluminescent device 100 is an OLED (organic light-emitting diode). In practice, the electroluminescent device 100 can also be a QLED (quantum dot light emitting diode). Embodiments of the present application are not limited in this regard.

To sum up, in the electroluminescent device according to embodiments of the present application, the target film comprises a large molecular layer and a small molecular layer which are arranged in a stacked manner, so that the thickness of the large molecular layer in the target film is reduced. In addition, the smaller the thickness of the large molecular layer is, the more easily the large molecular layer can be formed by the solution process. As a result, the large molecular layer in the present application can be formed easily. During forming the small molecular layer by the solution process, the viscosity of the solution for forming the small molecular layer does not increase, so that the small molecular layer can be formed at reduced difficulty. Thus, the entire target film can be formed easily, and the display panel can be fabricated at reduced difficulty.

An embodiment of the present application provides a method for fabricating an electroluminescent device. The method for fabricating an electroluminescent device can be used to form the electroluminescent device as shown in FIG. 1, the method for fabricating an electroluminescent device comprises:

forming an electroluminescent device on a substrate.

The electroluminescent device for example comprises: a hole inject layer, a hole transport layer, an electron transport layer, and an electron inject layer. At least one of the hole inject layer, the hole transport layer, the electron transport layer, and the electron inject layer is the target film. The target film comprises a small molecular layer and a large molecular layer which are arranged in a stacked manner.

To sum up, in the electroluminescent device fabricated by the method for fabricating an electroluminescent device in embodiments of the present application, the target film comprises the large molecular layer and the small molecular layer which are arranged in a stacked manner, so that the thickness of the large molecular layer in the target film is reduced. In addition, the smaller the thickness of the large molecular layer is, the more easily the large molecular layer can be formed by the solution process. As a result, the large molecular layer in the present application can be formed easily. During forming the small molecular layer by the solution process, the viscosity of the solution for forming the small molecular layer does not increase, so that the small molecular layer can be formed at reduced difficulty. Thus, the entire target film can be formed easily, and the display panel can be fabricated at reduced difficulty.

It is noted that, forming the electroluminescent device on the substrate comprises: forming a first electrode, the hole inject layer, the hole transport layer, the electroluminescent layer, the electron transport layer, the electron inject layer, and a second electrode which are arranged in a stacked manner, on the substrate.

Figure 8:
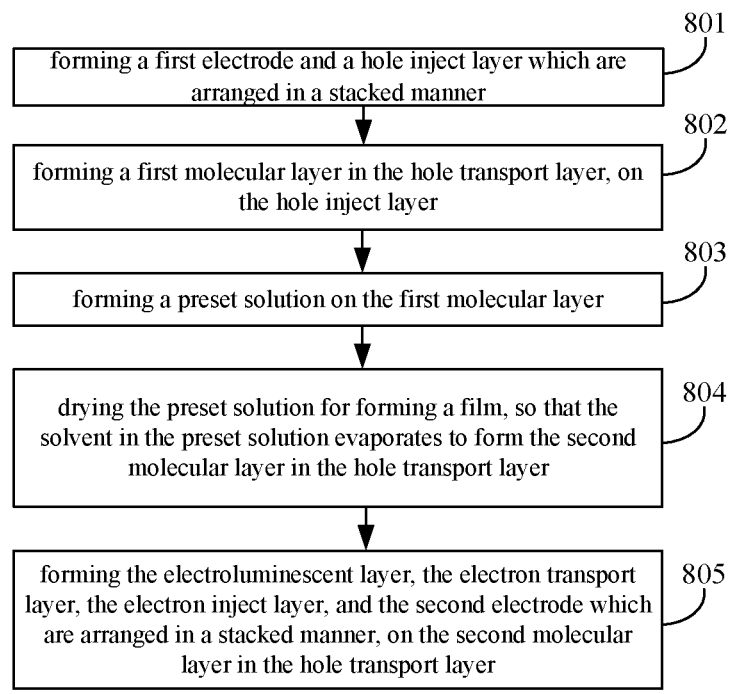
FIG. 8 is a flow chart for illustrating a method for fabricating an electroluminescent device in an embodiment of the present application.

FIG. 8 is a flow chart for illustrating a method for fabricating an electroluminescent device in an embodiment of the present application. The method for fabricating an electroluminescent device can be used to form the electroluminescent device shown in FIG. 1. As shown in FIG. 8, the method for fabricating an electroluminescent device comprises:

Step 801, forming a first electrode and a hole inject layer which are arranged in a stacked manner.

As an example, in Step 801, a first electrode material is formed on the substrate, and the first electrode material layer is patterned for one time to form the first electrode. Then, a solution for forming the hole inject layer is formed on the first electrode by inkjet printing, and the solution is dried for forming a film, so that the solvent in the solution evaporates to form the hole inject layer. The solvent in the solution can be a non-polar solvent. It is noted that, patterning the first electrode material layer for one time comprises: coating a layer of photoresist on the first electrode material layer; exposing the photoresist with a mask to form a completely exposed region and an unexposed region of the photoresist; developing the photoresist to remove the photoresist in the completely exposed region and retain the photoresist in the unexposed region; etching the first electrode material layer in a region corresponding to the completely exposed region; and stripping off the photoresist in the unexposed region to obtain the first electrode.

Step 802, forming a first molecular layer in the hole transport layer, on the hole inject layer.

As an example, in Step 802, a solution for forming the first molecular layer is formed on the hole inject layer by inkjet printing, and the solution is dried for forming a film, so that the solvent in the solution evaporates to form the first molecular layer. The solvent in the solution is a polar solvent. Since this solvent is of a different type from the solvent in the solution for forming the hole inject layer, this solvent does not dissolve the hole inject layer.

The hole transport layer comprises a small molecular layer and a large molecular layer. The first molecular layer is the small molecular layer, and the second molecular layer is the large molecular layer. Alternatively, the first molecular layer is the large molecular layer, and the second molecular layer is the small molecular layer.

Step 803, forming a preset solution on the first molecular layer.

It is noted that, the solute of the preset solution comprises: cross-linking groups, and molecules in the second molecular layer of the hole transport layer. In addition, in Step 803, the preset solution is formed on the first molecular layer by inkjet printing, and the solvent in the preset solution is a polar solvent.

Step 804, drying the preset solution for forming a film, so that the solvent in the preset solution evaporates to form the second molecular layer in the hole transport layer.

The second molecular layer in the hole transport layer comprises a cross-linked network structure which is formed by the cross-linking groups.

Step 805, forming the electroluminescent layer, the electron transport layer, the electron inject layer, and the second electrode which are arranged in a stacked manner, on the second molecular layer in the hole transport layer.

As an example, in Step 805, a solution for forming the electroluminescent layer is formed on the second molecular layer by inkjet printing, and the solution is dried for forming a film, so that the solvent in the solution evaporates to form the electroluminescent layer. The solvent in the solution is a polar solvent. Then, the electron transport layer, the electron inject layer, and the second electrode which are arranged in a stacked manner are formed on the electroluminescent layer by evaporation.

It is noted that, in the method for fabricating an electroluminescent device as shown in FIG. 8, the solvent in the solution for forming the hole inject layer is a non-polar solvent, and the solvent in the solution for forming the first molecular layer in the hole transport layer is a polar solvent. Namely, the solvent in the solution for forming the hole inject layer is of a different type from the solvent in the solution for forming the first molecular layer. In practice, the solvent in the solution for forming the hole inject layer can be of a same type as the solvent in the solution for forming the first molecular layer (e.g., both are polar solvents or both are non-polar solvents). Embodiments of the present application are not limited in this regard.

In case the solvent in the solution for forming the hole inject layer is of a same type as the solvent in the solution for forming the first molecular layer, the hole inject layer comprises a cross-linked network structure. The cross-linked network structure prevents the hole inject layer from being dissolved by the solvent in the solution for forming the first molecular layer, and the solute in the solution for forming the hole inject layer comprises cross-linking groups.

In addition, in the method for fabricating an electroluminescent device as shown in FIG. 8, both the electron transport layer and the electron inject layer are formed by evaporation. In practice, both the electron transport layer and the electron inject layer can be formed by a solution process. Embodiments of the present application are not limited in this regard.

In case both the electron transport layer and the electron inject layer are formed by the solution process, and the solvent in the solution for forming the electroluminescent layer, the solvent in the solution for forming the electron transport layer, and the solvent in the solution for forming the electron inject layer are of the same type, the electroluminescent layer can comprise a cross-linked network structure, which is configured to prevent the electroluminescent layer from being dissolved by the solvent in the solution for forming the electron transport layer. The solute in the solution for forming the electroluminescent layer can comprise cross-linking groups. The electron transport layer can also comprise a cross-linked network structure, which can prevent the electron transport layer from being dissolved by the solvent in the solution for forming electron inject layer, and the solute in the solution for forming the electron transport layer can comprise cross-linking groups.

Figure 9:
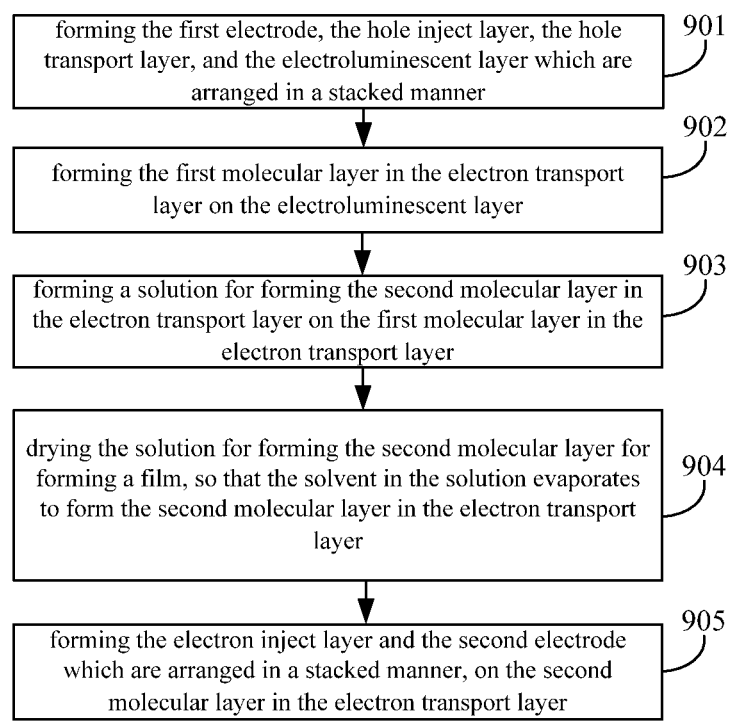
FIG. 9 is a flow chart for illustrating a method for fabricating an electroluminescent device in another embodiment of the present application flow chart.

FIG. 9 is a flow chart for a method for fabricating an electroluminescent device in another embodiment of the present application. The method for fabricating an electroluminescent device can be used to form the electroluminescent device shown in FIG. 3. As shown in FIG. 9, the method for fabricating an electroluminescent device comprises:

Step 901, forming the first electrode, the hole inject layer, the hole transport layer, and the electroluminescent layer which are arranged in a stacked manner.

Step 902, forming the first molecular layer in the electron transport layer on the electroluminescent layer.

Step 903, forming a solution for forming the second molecular layer in the electron transport layer on the first molecular layer in the electron transport layer.

The solute in the solution for forming the second molecular layer comprises cross-linking groups, and molecules in the second molecular layer in the electron transport layer.

Step 904, drying the solution for forming the second molecular layer for forming a film, so that the solvent in the solution evaporates to form the second molecular layer in the electron transport layer.

The second molecular layer in the electron transport layer comprises a cross-linked network structure which is formed by the cross-linking groups.

Step 905, forming the electron inject layer and the second electrode which are arranged in a stacked manner, on the second molecular layer in the electron transport layer.

Figure 10:
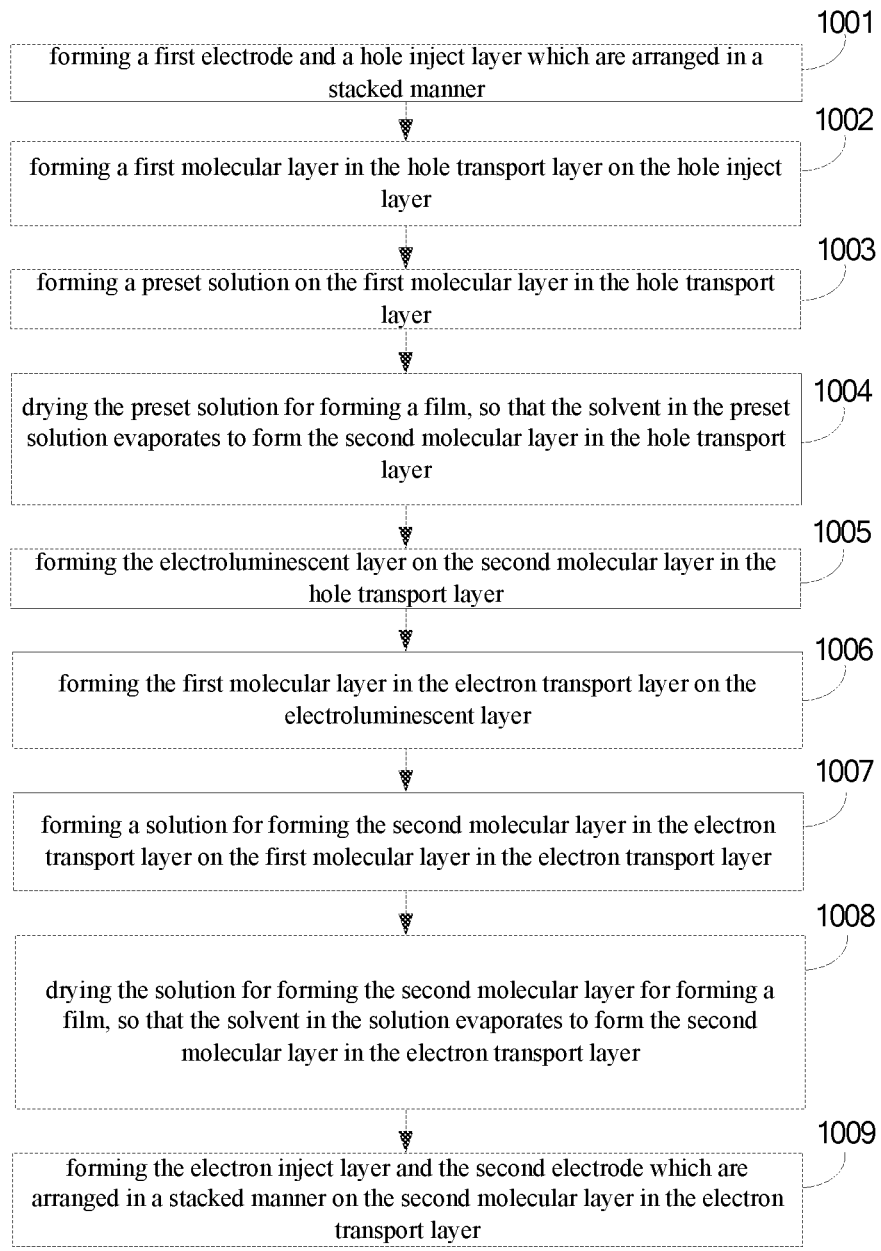
FIG. 10 is a flow chart for illustrating a method for fabricating an electroluminescent device in yet another embodiment of the present application.

FIG. 10 is a flow chart for a method for fabricating an electroluminescent device in yet another embodiment of the present application. The method for fabricating an electroluminescent device can be used to form the electroluminescent device shown in FIG. 4. As shown in FIG. 10, the method for fabricating an electroluminescent device comprises:

Step 1001, forming a first electrode and a hole inject layer which are arranged in a stacked manner.

Step 1002, forming a first molecular layer in the hole transport layer on the hole inject layer.

Step 1003, forming a preset solution on the first molecular layer in the hole transport layer.

The solute in the preset solution comprises cross-linking groups, and molecules in the second molecular layer in the hole transport layer.

Step 1004, drying the preset solution for forming a film, so that the solvent in the preset solution evaporates to form the second molecular layer in the hole transport layer.

The second molecular layer in the hole transport layer comprises a cross-linked network structure which is formed by the cross-linking groups.

Step 1005, forming the electroluminescent layer on the second molecular layer in the hole transport layer.

Step 1006, forming the first molecular layer in the electron transport layer on the electroluminescent layer.

Step 1007, forming a solution for forming the second molecular layer in the electron transport layer on the first molecular layer in the electron transport layer.

The solute in the solution for forming the second molecular layer comprises cross-linking groups, and molecules in the second molecular layer in the electron transport layer.

Step 1008, drying the solution for forming the second molecular layer for forming a film, so that the solvent in the solution evaporates to form the second molecular layer in the electron transport layer.

The second molecular layer in the electron transport layer comprises a cross-linked network structure which is formed by the cross-linking groups.

Step 1009, forming the electron inject layer and the second electrode which are arranged in a stacked manner on the second molecular layer in the electron transport layer.

Figure 11:
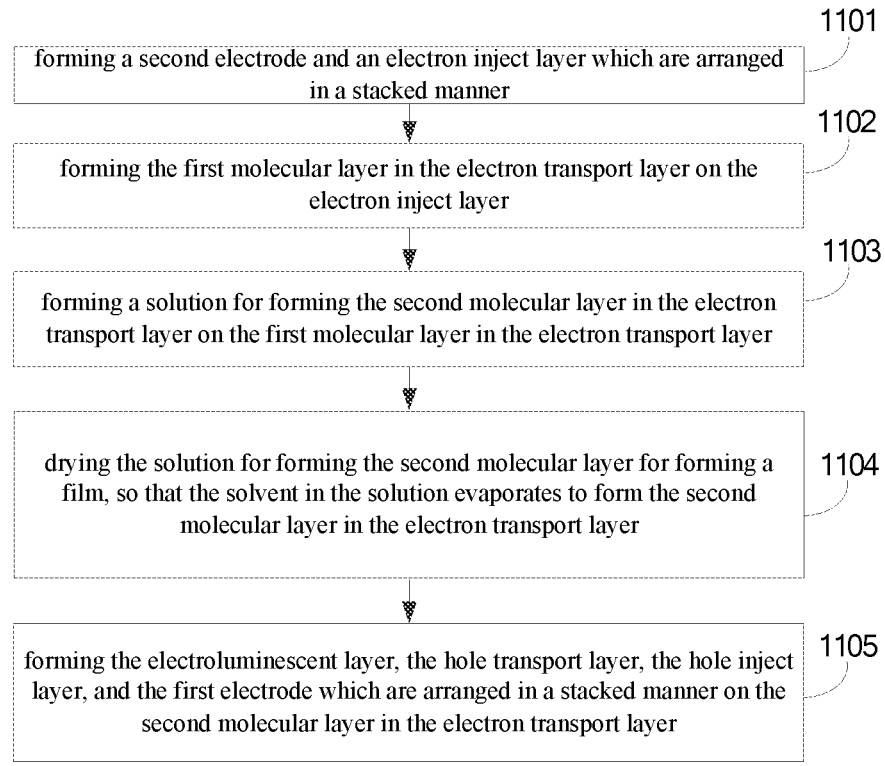
FIG. 11 is a flow chart for illustrating a method for fabricating an electroluminescent device in still another embodiment of the present application.

FIG. 11 is a flow chart for a method for fabricating an electroluminescent device in still another embodiment of the present application. The method for fabricating an electroluminescent device can be used to form the electroluminescent device shown in FIG. 5. As shown in FIG. 11, the method for fabricating an electroluminescent device comprises:

Step 1101, forming a second electrode and an electron inject layer which are arranged in a stacked manner.

Step 1102, forming the first molecular layer in the electron transport layer on the electron inject layer.

Step 1103, forming a solution for forming the second molecular layer in the electron transport layer on the first molecular layer in the electron transport layer.

The solute in the solution for forming the second molecular layer comprises cross-linking groups, and molecules in the second molecular layer in the electron transport layer.

Step 1104, drying the solution for forming the second molecular layer for forming a film, so that the solvent in the solution evaporates to form the second molecular layer in the electron transport layer.

The second molecular layer in the electron transport layer comprises a cross-linked network structure which is formed by the cross-linking groups.

Step 1105, forming the electroluminescent layer, the hole transport layer, the hole inject layer, and the first electrode which are arranged in a stacked manner on the second molecular layer in the electron transport layer.

Figure 12:
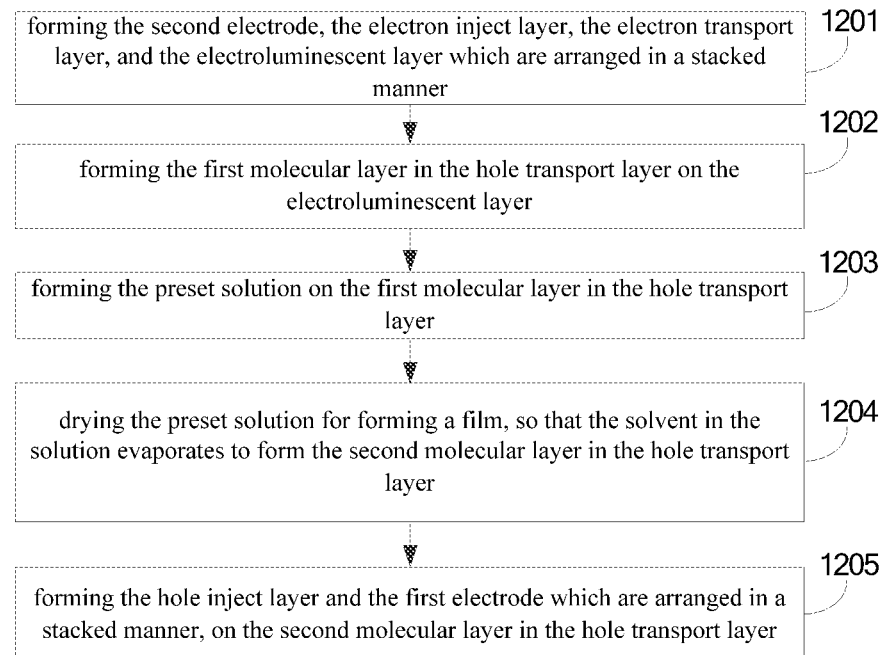
FIG. 12 is a flow chart for illustrating a method for fabricating an electroluminescent device in still another embodiment of the present application.

FIG. 12 is a flow chart for a method for fabricating an electroluminescent device in still another embodiment of the present application. The method for fabricating an electroluminescent device can be used to form the electroluminescent device shown in FIG. 6. As shown in FIG. 12, the method for fabricating an electroluminescent device comprises:

Step 1201, forming the second electrode, the electron inject layer, the electron transport layer, and the electroluminescent layer which are arranged in a stacked manner.

Step 1202, forming the first molecular layer in the hole transport layer on the electroluminescent layer.

Step 1203, forming the preset solution on the first molecular layer in the hole transport layer.

The solute in the preset solution comprises cross-linking groups, and molecules in the second molecular layer in the hole transport layer.

Step 1204, drying the preset solution for forming a film, so that the solvent in the solution evaporates to form the second molecular layer in the hole transport layer.

The second molecular layer in the hole transport layer comprises a cross-linked network structure which is formed by the cross-linking groups.

Step 1205, forming the hole inject layer and the first electrode which are arranged in a stacked manner, on the second molecular layer in the hole transport layer.

Figure 13:
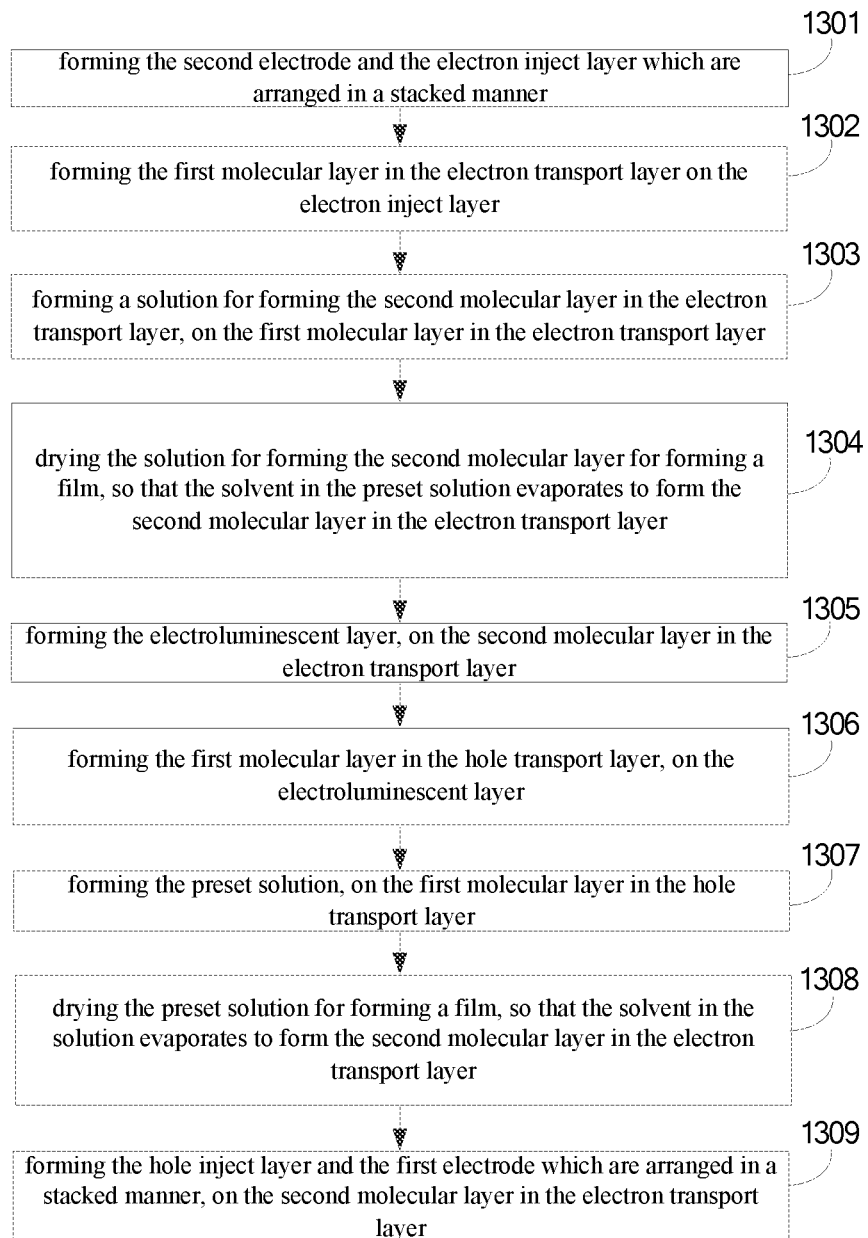
FIG. 13 is a flow chart for illustrating a method for fabricating an electroluminescent device in still another embodiment of the present application.

FIG. 13 is a flow chart for a method for fabricating an electroluminescent device in still another embodiment of the present application. The method for fabricating an electroluminescent device can be used to form the electroluminescent device shown in FIG. 7. As shown in FIG. 13, the method for fabricating an electroluminescent device comprises:

Step 1301, forming the second electrode and the electron inject layer which are arranged in a stacked manner.

Step 1302, forming the first molecular layer in the electron transport layer on the electron inject layer.

Step 1303, forming a solution for forming the second molecular layer in the electron transport layer, on the first molecular layer in the electron transport layer.

The solute in the solution for forming the second molecular layer comprises cross-linking groups, and molecules in the second molecular layer in the electron transport layer.

Step 1304, drying the solution for forming the second molecular layer for forming a film, so that the solvent in the preset solution evaporates to form the second molecular layer in the electron transport layer.

The second molecular layer in the electron transport layer comprises a cross-linked network structure which is formed by the cross-linking groups.

Step 1305, forming the electroluminescent layer, on the second molecular layer in the electron transport layer.

Step 1306, forming the first molecular layer in the hole transport layer, on the electroluminescent layer.

Step 1307, forming the preset solution, on the first molecular layer in the hole transport layer.

The solute in the preset solution comprises cross-linking groups, and molecules in the second molecular layer in the hole transport layer.

Step 1308, drying the preset solution for forming a film, so that the solvent in the solution evaporates to form the second molecular layer in the electron transport layer.

The second molecular layer in the electron transport layer comprises a cross-linked network structure which is formed by the cross-linking groups.

Step 1309, forming the hole inject layer and the first electrode which are arranged in a stacked manner, on the second molecular layer in the electron transport layer.

It is noted that, films in the electroluminescent device are formed by a solution process in embodiments of the present application, and inkjet printing is described as an example for forming for the solution for forming films. In practice, the solution for forming films can be formed by another method, e.g., by spin-coating. Embodiments of the present application are not limited in this regard.

In summary, in the electroluminescent device fabricated by the method for fabricating an electroluminescent device in embodiments of the present application, the target film comprises the large molecular layer and the small molecular layer which are arranged in a stacked manner, so that the thickness of the large molecular layer in the target film is reduced. In addition, the smaller the thickness of the large molecular layer is, the more easily the large molecular layer can be formed by the solution process. As a result, the large molecular layer in the present application can be formed easily. During forming the small molecular layer by the solution process, the viscosity of the solution for forming the small molecular layer does not increase, so that the small molecular layer can be formed at reduced difficulty. Thus, the entire target film can be formed easily, and the display panel can be fabricated at reduced difficulty.

Embodiments of the present application further provide a display panel, which comprises a substrate, and a plurality of electroluminescent devices on the substrate, and the electroluminescent devices are the electroluminescent device as shown in any one of FIGS. 1-7.

Embodiments of the present application further provide a display device, which comprises the display panel as described. As an example, the display device is any product or component with a display function, e.g., electronic paper, OLED panel, mobile phone, tablet computer, TV set, monitor, notebook computer, digital photo frame, navigator, wearable display device.

It is noted that in the present application, embodiments of the electroluminescent device, embodiments of the method for fabricating an electroluminescent device, embodiments of the display panel, and embodiments of the display device can be referenced with each other, and embodiments of the present application are not limited in this regard. In embodiments of the method of the present application, the sequence in which steps can be modified appropriately, and some steps can be added while some steps can be omitted. It is understood by a person with ordinary skill in the art that any method with obvious modification within the present application falls within the scope of the present application, which is not repeated for simplicity.

In the present application, the term "and/or" only describes a correlation between correlated objects, and indicates there are three relationships. For example, A and/or B can indicate only presence of A, presence of both A and B, and only presence of B. In addition, the symbol "/" generally indicates a "or" relationship between objects linked by this symbol.

Other embodiments of the present application will be apparent to those skilled in the art from consideration of the specification and practice of the present application disclosed here. The present application is intended to cover any variations, uses, or adaptations of the present application following the general principles thereof and including such departures from the present application as come within known or customary practice in the art. It is intended that the specification and embodiments be considered as exemplary only, with a true scope and spirit of the present application being indicated by the following claims.

It will be appreciated that the present application is not limited to the exact construction that has been described above and illustrated in the accompanying drawings, and that various modifications and changes can be made without departing from the scope thereof. It is intended that the scope of the present application only be limited by the appended claims.

What is claimed is:

1. An electroluminescent device, comprising a hole inject layer, a hole transport layer, an electroluminescent layer, an electron transport layer, and an electron inject layer,
   wherein at least one of the hole inject layer, the hole transport layer, the electron transport layer, and the electron inject layer is a target film comprising a small molecular layer with a small molecule and a large molecular layer with a large molecule which are arranged in a stacked manner, and
   wherein the large molecular layer of the target film is closer to the electroluminescent layer than the small molecular layer of the target film, and the large molecular layer has a cross-linked network structure
   wherein a relative molecular mass of the large molecule of the large molecular layer ranges from several thousands to several millions, and a relative molecular mass of the small molecule of the small molecular layer is smaller than five hundreds, and
   wherein the small molecular layer has a thickness larger than that of the large molecular layer.

2. The electroluminescent device of claim 1, comprising a first electrode, the hole inject layer, the hole transport layer, the electroluminescent layer, the electron transport layer, the electron inject layer, and a second electrode which are arranged in a stacked manner.

3. The electroluminescent device of claim 2, wherein the hole transport layer is the target film.

4. The electroluminescent device of claim 3, wherein an HOMO energy level of the small molecular layer and an HOMO energy level of the large molecular layer increase in a hole transport direction of the electroluminescent device.

5. The electroluminescent device of claim 4, wherein a molecular layer of the hole transport layer away from the electroluminescent layer has an HOMO energy level of 4.6 eV, and a molecular layer close to the electroluminescent layer has an HOMO energy level of 4.76 eV.

6. The electroluminescent device of claim 4, wherein a molecular layer of the hole transport layer away from the electroluminescent layer has an HOMO energy level of 5.1 eV, and a molecular layer close to the electroluminescent layer has an HOMO energy level of 5.7 eV.

7. The electroluminescent device of claim 3, wherein a molecular layer of the hole transport layer close to the electroluminescent layer has the cross-linked network structure.

8. The electroluminescent device of claim 1, wherein a material for the large molecular layer is polythiophene or polyaniline, and a material for the small molecular layer is ethylenedioxythiophene or triphenylamine.

9. The electroluminescent device of claim 2, wherein both a material for the first electrode and a material for the second electrode are tin indium oxide, a material for the electron transport layer is tungsten oxide, a material for the electron inject layer is molybdenum oxide, and a material for the hole inject layer is vanadium oxide.

10. A method for fabricating an electroluminescent device, comprising:

forming an electroluminescent device on a substrate, wherein the electroluminescent device comprises a hole inject layer, a hole transport layer, an electroluminescent layer, an electron transport layer, and an electron inject layer, wherein at least one of the hole inject layer, the hole transport layer, the electron transport layer, and the electron inject layer is a target film comprising a small molecular layer with a small molecule and a large molecular layer with a large molecule which are arranged in a stacked manner, and wherein the large molecular layer of the target film is closer to the electroluminescent layer than the small molecular layer of the target film, and the large molecular layer has a cross-linked network structure, wherein a relative molecular mass of the large molecule of the large molecular layer ranges from several thousands to several millions, and a relative molecular mass of the small molecule of the small molecular layer is smaller than five hundreds, and wherein the small molecular layer has a thickness larger than that of the large molecular layer.

11. A display panel, comprising a substrate, and a plurality of electroluminescent devices of claim 1 on the substrate.

* * * * *